(12) United States Patent
Yuh

(10) Patent No.: US 10,464,825 B2
(45) Date of Patent: Nov. 5, 2019

(54) SYSTEM AND METHOD FOR SORBTION DISTILLATION

(71) Applicant: Howard Y. Yuh, Yardley, PA (US)

(72) Inventor: Howard Y. Yuh, Yardley, PA (US)

( * ) Notice: Subject to any disclaimer, the term of this patent is extended or adjusted under 35 U.S.C. 154(b) by 0 days.

(21) Appl. No.: 16/164,942

(22) Filed: Oct. 19, 2018

(65) Prior Publication Data

US 2019/0119126 A1 Apr. 25, 2019

Related U.S. Application Data

(62) Division of application No. 15/637,236, filed on Jun. 29, 2017, now Pat. No. 10,150,681.

(Continued)

(51) Int. Cl.
*B01D 1/26* (2006.01)
*C02F 1/04* (2006.01)
(Continued)

(52) U.S. Cl.
CPC ............ *C02F 1/048* (2013.01); *B01D 1/0035* (2013.01); *B01D 3/04* (2013.01); *B01D 15/08* (2013.01); *B01J 20/046* (2013.01); *B01J 20/20* (2013.01); *B01J 20/283* (2013.01); *B01J 20/28004* (2013.01); *B01J 20/28014* (2013.01); *C02F 1/12* (2013.01); *C02F 1/14* (2013.01); *C02F 1/265* (2013.01); *F24S 20/20* (2018.05); *F24S 23/77* (2018.05); *F24S 23/79* (2018.05);
(Continued)

(58) Field of Classification Search
CPC ................ B01D 53/04; B01D 53/0407; B01D 53/0415; B01D 53/0423; B01D 53/0431; B01D 53/0438; B01D 53/0446; B01D 53/14; B01D 53/1406; B01D 1/04; B01D 1/06; B01D 1/065; B01D 1/08; B01D 1/10; B01D 1/12; B01D 1/26; B01D 3/146; B01D 3/34
USPC ...... 159/17.1, 17.2, 17.3, 17.4, 18, 19, 20.1, 159/20.2
See application file for complete search history.

(56) References Cited

U.S. PATENT DOCUMENTS 3,099,607 A 7/1963 Lustenader et al.
3,734,835 A * 5/1973 Spicacci ................ B01D 3/065
159/2.3

(Continued)

OTHER PUBLICATIONS

C.A. Schlosser et.al., "The Future of Global Water Stress: An Integrated Assessment," MIT, Cambridge, MA, MIT Joint Program on the Science and Policy of Global Change 254, 2014.

(Continued)

*Primary Examiner* — Jonathan Miller
*Assistant Examiner* — Jonathan Luke Pilcher
(74) *Attorney, Agent, or Firm* — Meagher Emanuel Laks Goldberg & Liao, LLP

(57) ABSTRACT

A system for distilling water is disclosed. The system comprises a heat source, and a plurality of open-cycle adsorption stages, each stage comprising a plurality of beds and an evaporator and a condenser between a first bed and a second bed, wherein each bed comprises at least two vapor valves, a plurality of hollow tubes, a plurality of channels adapted for transferring water vapor to and from at least one of the condenser or the evaporator, a thermally conductive water vapor adsorbent, and wherein each vapor valve connects a bed to either the condenser or the evaporator.

12 Claims, 10 Drawing Sheets

Related U.S. Application Data

(60) Provisional application No. 62/356,126, filed on Jun. 29, 2016.

(51) Int. Cl.

| | | |
|---|---|---|
| *B01J 20/20* | (2006.01) | |
| *B01J 20/04* | (2006.01) | |
| *B01J 20/283* | (2006.01) | |
| *B01J 20/28* | (2006.01) | |
| *B01D 1/00* | (2006.01) | |
| *B01D 3/04* | (2006.01) | |
| *B01D 15/08* | (2006.01) | |
| *C02F 1/12* | (2006.01) | |
| *C02F 1/14* | (2006.01) | |
| *C02F 1/26* | (2006.01) | |
| *H01L 31/054* | (2014.01) | |
| *H02S 20/10* | (2014.01) | |
| *H02S 20/32* | (2014.01) | |
| *H02S 40/44* | (2014.01) | |
| *F24S 23/79* | (2018.01) | |
| *F24S 20/20* | (2018.01) | |
| *F24S 23/77* | (2018.01) | |
| *B01D 3/14* | (2006.01) | |
| *C02F 1/28* | (2006.01) | |
| *C02F 103/08* | (2006.01) | |

(52) U.S. Cl.
CPC .......... *H01L 31/0547* (2014.12); *H02S 20/10* (2014.12); *H02S 20/32* (2014.12); *H02S 40/44* (2014.12); *B01D 1/26* (2013.01); *B01D 3/146* (2013.01); *B01D 2253/102* (2013.01); *B01D 2253/106* (2013.01); *C02F 1/04* (2013.01); *C02F 1/28* (2013.01); *C02F 2103/08* (2013.01); *Y02B 10/22* (2013.01); *Y02B 10/70* (2013.01); *Y02E 10/52* (2013.01); *Y02W 10/37* (2015.05)

(56) References Cited

U.S. PATENT DOCUMENTS

| | | | | |
|---|---|---|---|---|
| 5,569,534 | A | * | 10/1996 | Lambotte ................. B01J 20/20 |
| | | | | 428/402 |
| 5,775,126 | A | | 7/1998 | Sato |
| 6,490,875 | B2 | * | 12/2002 | Chua ..................... F25B 17/083 |
| | | | | 62/144 |
| 2008/0034785 | A1 | | 2/2008 | Yanagi |
| 2011/0048920 | A1 | | 3/2011 | Avery et al. |
| 2012/0119396 | A1 | | 5/2012 | Saha |
| 2013/0341177 | A1 | | 12/2013 | Ng et al. |
| 2017/0072336 | A1 | | 3/2017 | Ng et al. |

OTHER PUBLICATIONS

O.K. Buros, The ABCs of Desalting.: International Desalination Association, 2000.

O.A. Hamed, "Overview of hybrid desalination systems—current status and future prospects," Saline Water Conversion Corporation (SWCC), Al-Jubail, Saudi Arabia, 2004.

M.T. Ali et.al., "A comprehensive techno-economical review of indirect solar desalination,"; Renewable and Sustainable Energy Reviews, vol. 15, pp. 4187-4199, 2011.

J. E. Miller, "Review of Water Resources and desalination technologies," Sandia National Laboratories, Albuquerque, New Mexico, SAND Report 2003-0800, 2003.

S. Chaudhry. (Oct. 2012) New and Emerging Desalination. http://www.iapws.org/minutes/2012/Symp-Chaudhry.pdf.

J. Tonner, "Barriers to thermal desalination in the United States," U.S. Department of the Interior Bureau of Reclamation, Denver, CO, Desalination and Water Purification Research and Development Program Report 144, 2008.

Carlsbad Desalination Project, "Energy minimization and greenhouse gas reduction plan," San Diego,CA, 2008.

* cited by examiner

SYSTEM AND METHOD FOR SORBTION DISTILLATION

CROSS-REFERENCE TO RELATED APPLICATIONS

This application is a divisional of U.S. patent application Ser. No. 15/637,236, filed on Jun. 29, 2017. This application also claims benefit of U.S. Patent Application No. 62/356,126, filed Jun. 29, 2016, which is hereby incorporated in its entirety by reference.

BACKGROUND

Population growth, increasing precipitation variability from climate change, and aquifer depletion will result in water stress for over half the world population, >5 billion people, by 2050 (see C. A. Schlosser et. al., "The Future of Global Water Stress: An Integrated Assessment," MIT, Cambridge, Mass., MIT Joint Program on the Science and Policy of Global Change 254, 2014.). Desalination capacity is growing globally and within the US as water usage exceeds natural capacities. Grid-powered reverse osmosis (RO) is currently the most favored technology, but requires electricity, which remains mostly fossil-based.

Many review papers have been published comparing conventional and advanced desalination (see O. K. Buros, The ABCs of Desalting.: International Desalination Association, 2000; O. A. Hamed, "Overview of hybrid desalination systems—current status and future prospects," Saline Water Conversion Corporation (SWCC), Al-Jubail, Saudi Arabia, 2004; M. T. Ali et. al., "A comprehensive techno-economical review of indirect solar desalination,"; Renewable and Sustainable Energy Reviews, vol. 15, pp. 4187-4199, 2011; J. E. Miller, "Review of Water Resources and desalination technologies," Sandia National Laboratories, Albuquerque, N. Mex., SAND Report 2003-0800, 2003; S. Chaudhry. (2012, October) New and Emerging Desalination. http://www.iapws.org/minutes/2012/Symp-Chaudhry.pdf; J. Tonner, "Barriers to thermal desalination in the United States," U.S. Department of the Interior Bureau of Reclamation, Denver, Colo., Desalination and Water Purification Research and Development Program Report 144, 2008.)

Miller's 2003 SAND report succinctly describes the challenges of thermal processes: "All thermal distillation processes have one notable Achilles Heel, and that is the large amount of energy it takes to evaporate water (about 2200 kJ/kg) compared to the theoretical minimum energy required for desalination (3-7 kJ/kg)". Mechanical energy is easier to reuse, therefore reverse osmosis has become the most competitive desalination technique. The largest desalination plant being built in the US, the San Diego Carlsbad plant [Carlsbad Desalination Project, "Energy minimization and greenhouse gas reduction plan," San Diego, Calif., 2008], uses RO and achieves an estimated energy intensity of 3.6 kWh$_e$/m$^3$ (13 kJ$_e$/kg) after upgrades to state-of-the-art pressure exchangers.

Conventional thermal desalination techniques such as multiple-effect distillation (IVIED) and multi-stage flash (MSF) plants have been limited to gained output ratio (GOR/PR) of around 10 for several decades. The gained output ratio (GOR) is the ratio of input steam mass to product water mass. It is equivalent to the performance ratio (PR) which is kg of product water per 2326 kJ or lbs. of product water per 1000 BTUs. Simple single stage distillation would have a GOR or PR of 1. Improvements to the efficiency of these pure thermal cycles have come from using higher exergy energy to recycle low temperature latent heats. High pressure steam drives thermal vapor compression (TVC) and mechanical energy is used in mechanical vapor compression (MVC). However, these techniques incorporate power generation equipment to convert thermal energy to higher exergy input. Desalination using electrical or mechanical energy can seem more efficient as they outsource thermal losses to the energy conversion process. For example, Dean Kamen's Slingshot is a MVC distiller with an energy intensity of 24 kWh$_e$/m$^3$, but generates electricity using a 15% efficient Sterling engine (see S. L. Nasr. Howstuffworks. http://science.howstuffworks.com/environmental/green-tech/remediation/slingshot-water-purifier2.htm).

Solar thermal desalination faces challenges on two fronts: reducing energy intensity and collecting solar energy cost effectively. There would be immense benefit if direct solar-powered desalination could be made cost-competitive with grid-powered reverse osmosis.

A rapidly deploying, portable, and dynamically sized desalinator can significantly reduce the risk of stranded cost and barriers to entry. At 16,000 gallons per day (gpd) for each unit, a 1 Mgpd plant composed of 63 units could be transported across the US by a single train. Compared to current long lead-time desalination plants, time to water production could be reduced from a decade to weeks.

SUMMARY OF THE INVENTION

Disclosed is a distillation system, comprising a heat source and a plurality of open-cycle adsorption stages, each stage comprising a plurality of beds; and an evaporator and a condenser between a first stage hot adsorbent bed and a first stage cold adsorbent bed. In this embodiment, each bed comprises at least two vapor valves switching vapor flow between each bed and either the condenser or evaporator of the same stage, a plurality of hollow tubes, a plurality of channels adapted to facilitate water vapor flow between either the condenser or the evaporator and the bulk of either of the adsorbent beds. Each adsorbent bed is composed of a porous media, a hygroscopic material, and a plurality of graphite flakes.

Also disclosed is a method for distilling water. This method utilizes a plurality of stages, each stage comprising a hot adsorbent bed and a cold adsorbent bed, and functions by repeating cycles of a forcing phase followed by a relaxing phase. The forcing phase comprises the steps of providing a heat source to heat the hot bed of a first stage to a first temperature, desorbing water vapor from the hot bed of the first stage and flowing the water vapor into a first condenser, condensing water vapor in the first condenser to form a liquid water and removing at least some of the liquid water from the first condenser, providing a solution comprising water and at least one dissolved impurity to a first evaporator, transferring the latent heat from the first condenser to the first evaporator to partially evaporate the solution comprising water and at least one dissolved impurity to form water vapor and providing the remaining more concentrated solution to an evaporator of a subsequent stage, adsorbing water vapor from the first evaporator into the cold bed of the first stage, and transferring the heat of adsorption generated by the cold bed of the first stage to heat a hot bed of a second stage to a second temperature less than the first temperature. These steps are repeated for each of the plurality of stages until each of the beds has had water vapor desorbed from the bed or adsorbed into the bed. The relaxing phase comprises the steps of transferring both sensible heat and latent heat of adsorption from the hot bed of the first stage to the cold bed of the first stage. As the hot bed of the first stage reduces in temperature, it adsorbs water vapor from the evaporator of the first stage, while the increase in temperature of the cold bed in the first stage causes it to desorb water vapor into the first stage condenser, condensing water vapor to form a liquid water and removing at least some of the liquid water from the first stage condenser. A solution comprising water and at least one dissolved impurity is provided to the first stage evaporator, transferring the latent heat of vaporization from the first stage condenser to the first stage evaporator to evaporate said solution forming water vapor and providing the remaining more concentrated solution to the next stage evaporator, with the water vapor from the first stage evaporator flowing into and being adsorbed by the hot bed of the first stage. These steps are repeated for each of the plurality of stages. During this relaxation stage, a reduced amount or zero amount of heat from an external source is needed to drive the distillation process.

DETAILED DESCRIPTION OF THE INVENTION

Figure 1:
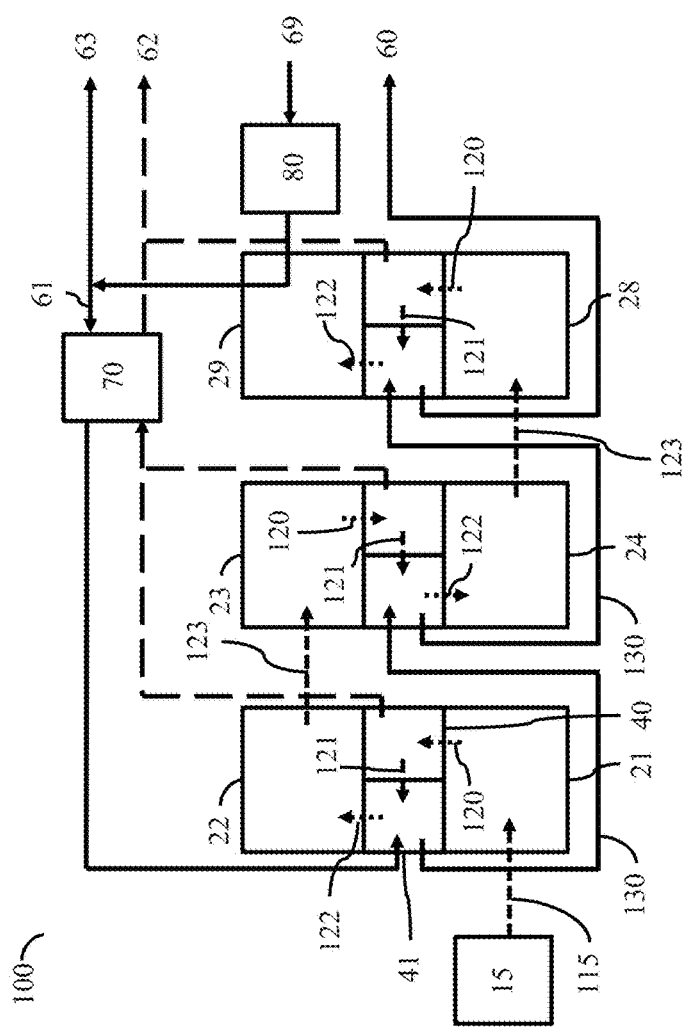
FIGS. 1-4 show embodiments of a distiller.

The disclosed adsorption distiller uses an adsorption bed to reduce the water vapor partial pressure above the evaporator, making the vaporization of water more efficient by reducing the required thermal drive. By recycling both the latent energy of vaporization and the heat of adsorption 32 times from the heat source to the heat exhaust, this cycle can achieve a Performance Ratio of 28, or 23 kWh thermal energy +0.1 kWh electrical energy per cubic meter of distilled water, when losses are included. This is about 3 times more efficient than existing thermal distillation techniques such as Multi-Stage Flash (MSF), Multiple Effect Distillation (MED), and at least 30 times more efficient than single-effect solar stills. Due to its simple design and the use of commodity adsorbent materials, a bill of a materials analysis estimates a reasonable cost for a 60 m$^3$/day solar-powered distiller which includes solar collectors and gravity-driven sand pretreatment. Because the distiller does not consume electricity or membranes, is highly automated, and requires modest pretreatment, the breakeven cost of water is relatively low without financing costs, even with moderate interest rates, assuming a 25 year distiller life.

The adsorption distiller uses an inexpensive industrial nanomaterial, silica gel, as a highly porous matrix for a hygroscopic salt, calcium chloride. This composite of hygroscopic calcium chloride impregnated in the internal pore surfaces of mesoporous silica gel has been studied since its discovery in 1996 by Aristov who called it a Selective Water Adsorbent (SWS). Note that there can be some ambiguity in the terminology used to describe the reaction, because while chemical absorption is occurring, reaction kinetics is enhanced by using an adsorbent to increase surface area and vapor transport. As described herein, the words "adsorption" and "adsorbed" are used to describe the reaction. Mesoporous silica gel has an average pore diameter of 15 nm with surface areas of, in many cases, about 400 m$^2$/gram but is relatively inexpensive. By confining a salt within the silica gel pores, SWS boosts uptake (adsorbed water mass per mass of adsorbent) above the physical adsorption capacity of silica gel. SWS also maintains a solid state with a very large reaction surface area. In the envisioned design, a single 16 stage distiller packaged in a shipping container would have a vapor adsorption area of 4160 square kilometers, more than the area of Rhode Island.

The adsorption distiller consists of a number of open-cycle adsorption stages connected in series, where the exhaust heat from an upper stage is used to drive the next stage. In a thermally driven heat pump, heat from a hot source is used to move heat from a cold evaporator to a warmer condenser. In the adsorption distiller, the evaporator and condenser are kept nearly isothermal using a high heat transfer coefficient flat plate condenser/evaporator. Since the source of water vapor is from the input liquid being distilled, this configuration maximizes the number of adsorption/desorption steps for any given temperature gradient. In the adsorption distiller, two features lead to the improvement in performance ratio. First, a large number of stages are chained serially. Second, the adsorption beds are arranged in such a way that one half of the cycle thermally drives a pair of adsorption beds out of equilibrium, while the other half is a relaxation towards equilibrium that requires no energy input. Since both halves of the cycle generate distillate, the theoretically efficiency is equal to the number of beds, or double the number of stages since each stage has a pair of adsorption beds.

Adsorption heat pumps based on silica gel have been studied for many years. However, one of the major difficulties with any silica gel based system has been inefficient heat transfer due to the low thermal conductivity of silica gel. The heat of adsorption has a value within 5-10% of the heat of vaporization, and can quickly raise the temperature of the adsorbent and slow or stop the adsorption process if not effectively removed. Previous attempts have used clay binders, waterglass, and conductive epoxies to thermally couple the silica gel with expensive extended metal heat sink structures. This issue is particularly important for the adsorption distiller as it relies on small temperature differentials, so the adsorbent temperature cannot elevate significantly during adsorption. We have based our design on a promising solution.

One approach uses expanded graphite, which can be thought of as a graphene precursor, where graphite particles have been sheared apart to a low number of carbon planes. When mixed with silica gel and mechanically compressed, the planar graphite particles align into sheets and dramatically improve inter-particle thermal transport in the plane perpendicular to the compression direction, increasing the in-plane thermal conductivity to 19 W/(m·K), a several hundred-fold improvement. The improvement in thermal conductivity and the recent availability of industrial quantities of expanded graphite and graphene precursors, allow us to design a greatly simplified adsorption bed using an array of vertical tubes to form a closed-loop boiler that conveys the heat of adsorption between stages using water vapor.

While flakes having a many layers are envisioned, the graphite flakes preferably have 100 layers of carbon planes or less. One embodiment comprises flakes having 100 layers of carbon planes in each flake, or a flake thickness of about 0.034 micron. Another embodiment comprises flakes having 50 layers of carbon planes in each flake. Another embodiment comprises flakes having 25 layers of carbon planes in each flake. Another embodiment comprises flakes having 10 layers of carbon planes in each flake. And yet another embodiment comprises flakes having 1 layer of carbon in each flake.

Additionally, while flakes may be of any dimensions, the graphite flakes are preferably below 300 microns in size (roughly 48 mesh or larger). One embodiment comprises flakes between 180 and 300 microns in size (approximately 48 to 80 mesh). Another embodiment comprises flakes between 150 and 180 microns in size. Another embodiment comprises flakes between 75 and 150 microns. And another embodiment comprises flakes less than 75 microns in size.

Additionally, while any concentration of graphite is envisioned for the graphite-salt composition, compositions comprising 50% or less graphite by weight are preferred. One preferred embodiment comprises between 15-30% graphite by weight. In one embodiment, the composition is binary, with the salt in silica gel making up the remainder of the weight. However, in other embodiments, the composition also includes additional materials, including but not limited to biologics, polymers or catalysts.

Cycle Operation

Figure 2:
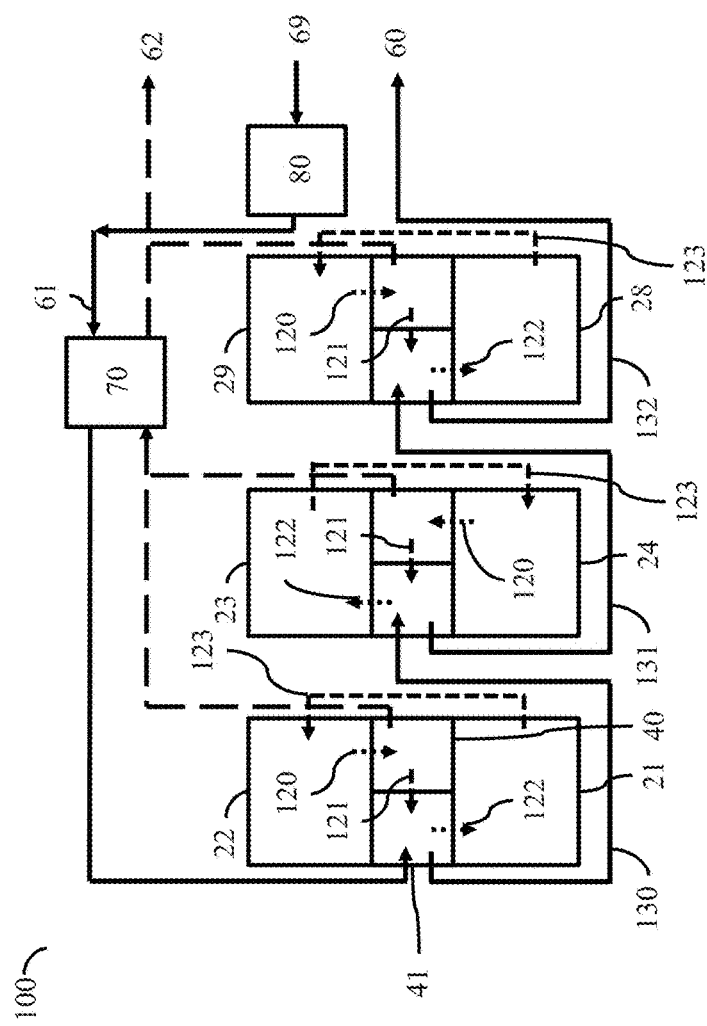

The disclosed system's cyclical operation is shown schematically in FIGS. 1 and 2 to illustrate the desalination cycle in both phases. In both figures, vapor flows are represented as dotted lines (see, e.g., 120, 122), heat flows are shown as dashed lines (see, e.g., 121, 123), brine flows as solid lines (see, e.g., 61, 130) and product water flows as long dashed lines (see, e.g., 62).

Each bed has an upper and lower temperature limit, where there is preferably less than about 20° C. difference between the upper and lower limit, and more preferably less than about 10° C. difference. The highest upper temperature being in the first hot chamber (21), which preferably has a temperature range of about 105 to 210° C., and more preferably from 143.5 to 150.0° C. As will be seen, the lower temperature limit of one chamber is the upper temperature limit of the next chamber. In this figure, the first hot chamber (21) is connected with the first cool chamber (22), and the first cool chamber (22) preferably has a temperature range of about 138.1 to 143.5° C., or a narrow range (typically less than about 6° C.) below that of the first chamber. The next chamber is the second hot chamber (23) which preferably has a temperature range of about 133.5 to 138.1° C., or a narrow range (typically less than about 6° C.) below that of the first cold chamber. The second cool chamber (24) preferably has a temperature range of about 129.5 to 133.5° C., or a narrow range (typically less than about 5° C.) below that of the second hot chamber. The third chambers (28) and (29) have preferred temperature ranges of about 125.6 to 129.5° C. and about 122.2 to 125.6° C., respectively. Fourth chambers, if they had been depicted, would have preferred temperature ranges of about 119.2 to 122.2° C., and about 116.4 to 119.2° C., respectively.

Like adsorption chiller cycles, half of each stage is adsorbing for half of the cycle and desorbing for the other half. However, unlike chiller cycles, this cycle produces no heat pumping effect. To distinguish the two phases of operation, the term "forcing" is used when heat is input to drive the two adsorbent beds in each stage out of equilibrium, and "relaxing" when the beds are allowed to return to equilibrium.

As shown in FIG. 1, during the "forcing" phase, the two beds in each stage (21 and 22, 23 and 24, 28 and 29) are driven out of equilibrium. Note that while only three stages are shown here, many stages may be utilized. Preferably, the number of stages is 6 or more, and more preferably the number of stages is between 12 and 40. In this phase, the bed operating at the highest temperature (21) is desorbed with heat (115) from a heat source (15), including but not limited to solar heat, while the hotter beds in every subsequent stage (23 and 28) is heated by recycling the heat of adsorption transferred between it and the colder bed of the next higher temperature stage (22 and 24, respectively) via boiled vapor, a circulating fluid, or any other method (see FIG. 3, elements 50, 55, and 30). During each phase, although heat is transferred between stages, water vapor produced from the input solution from the evaporator of each stage is kept within that single stage. Water vapor desorbing from (21) will pass into a condenser (40) where it will condense (120) and transfer its latent heat (121) to an evaporator (41). This process water will typically be passed back through a heat exchanger (70) to transfer its sensible heat to the incoming solution. The evaporator (41) will evaporate the input solution (122), and that vapor will adsorb into the next bed (22). The heat of adsorption from (22) is then transferred (123) to desorb the next stage (23), and the process repeats through each stage until the final stage, which is cooled by seawater when used for seawater desalination (69) after it flows through a seawater intake (80), but can also be cooled by any other external heat sink, which can include an evaporative cooling tower, or heat exchange with the ambient air, the input water source, or the ground. A fraction of the cooling seawater will serve as intake water (61), typically passed through one or more heat exchangers (70) with either or both the distillate and the brine before being fed to an evaporator (41), typically that of the first stage. Seawater not used as intake water (61) will typically be rejected (63). Brine from one stage will be transferred (130) to next stage, passing through a heat exchanger (70) if the next stage operates at a lower brine temperature. No exit brine (60) heat recovery is necessary due to the low exit brine temperature, which is preferably around 23.6° C. or below 40° C.

As shown in FIG. 2, when the system is in the "relaxing" phase, a greatly reduced amount or no external heat is needed for water production. Each bed will produce the same amount of water per adsorb-desorb cycle. Therefore, the thermal GOR/PR of this device is ideally equal to the number of beds rather than the number of stages, 32 in a preferred design (16 stages, 2 beds per stage, also see FIG. 9). There will be losses from imperfect insulation and the heating of components, but these effects are only estimated to be around 5%. The hot and cold beds of each stage are allowed to "relax" or equilibrate by circulating fluid or by boiling and condensing vapor using a set of internal boiling tubes (see FIG. 4, element 55) embedded within the adsorbent matrix. As each hotter bed (21, 23, 28) cools, it will adsorb (122) vapor from brine, while each colder bed (22, 24, 29) will desorb (120) water into the condenser as it warms, transferring its latent heat (121) to the evaporator. The system is therefore in energy balance as an equal amount of water is adsorbing/desorbing and evaporating/condensing. This "relaxing" phase can be simply thought of as two adsorption beds that have been thermally driven apart equilibrating their temperatures and uptake, the amount of adsorbed water.

Figure 3:
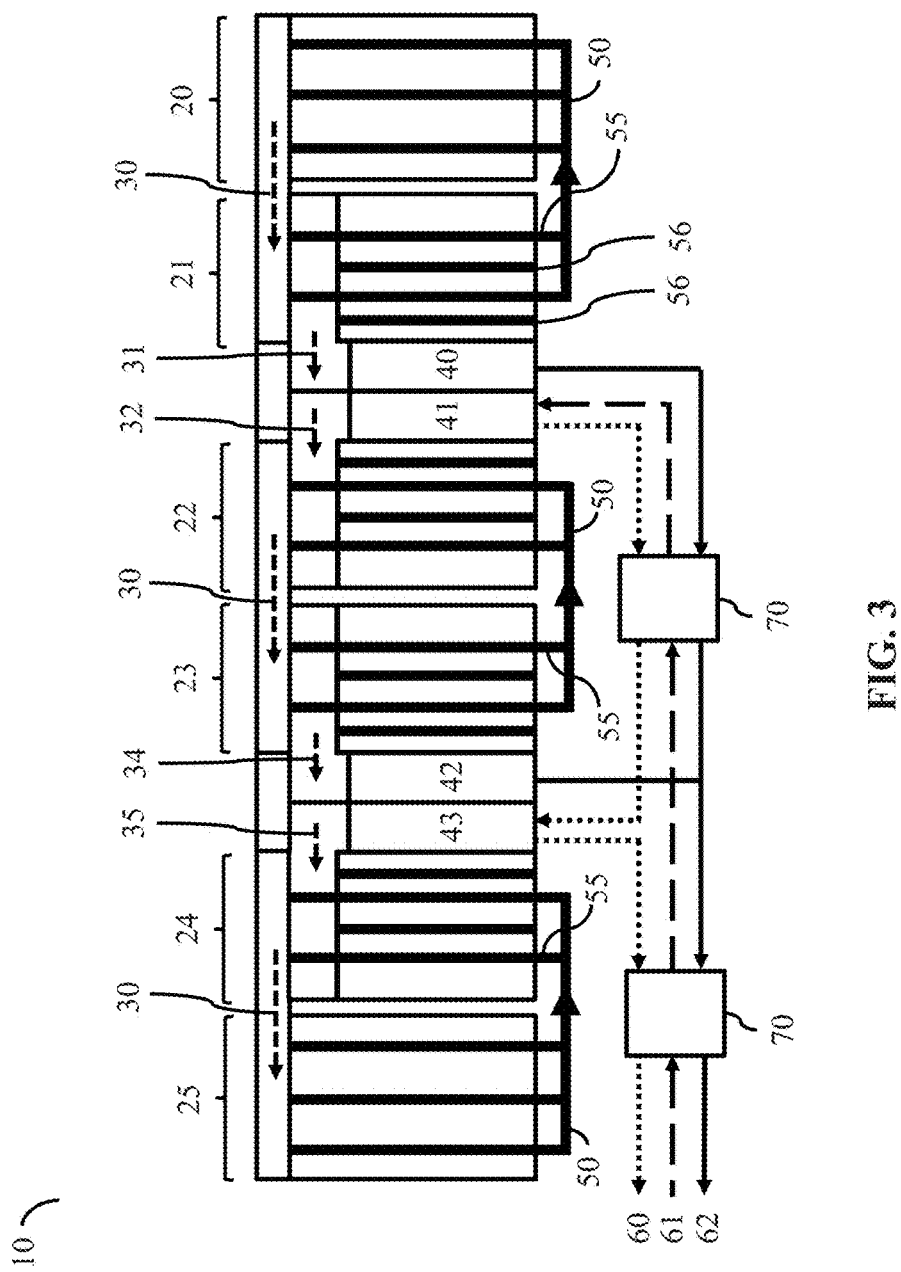
Figure 4:
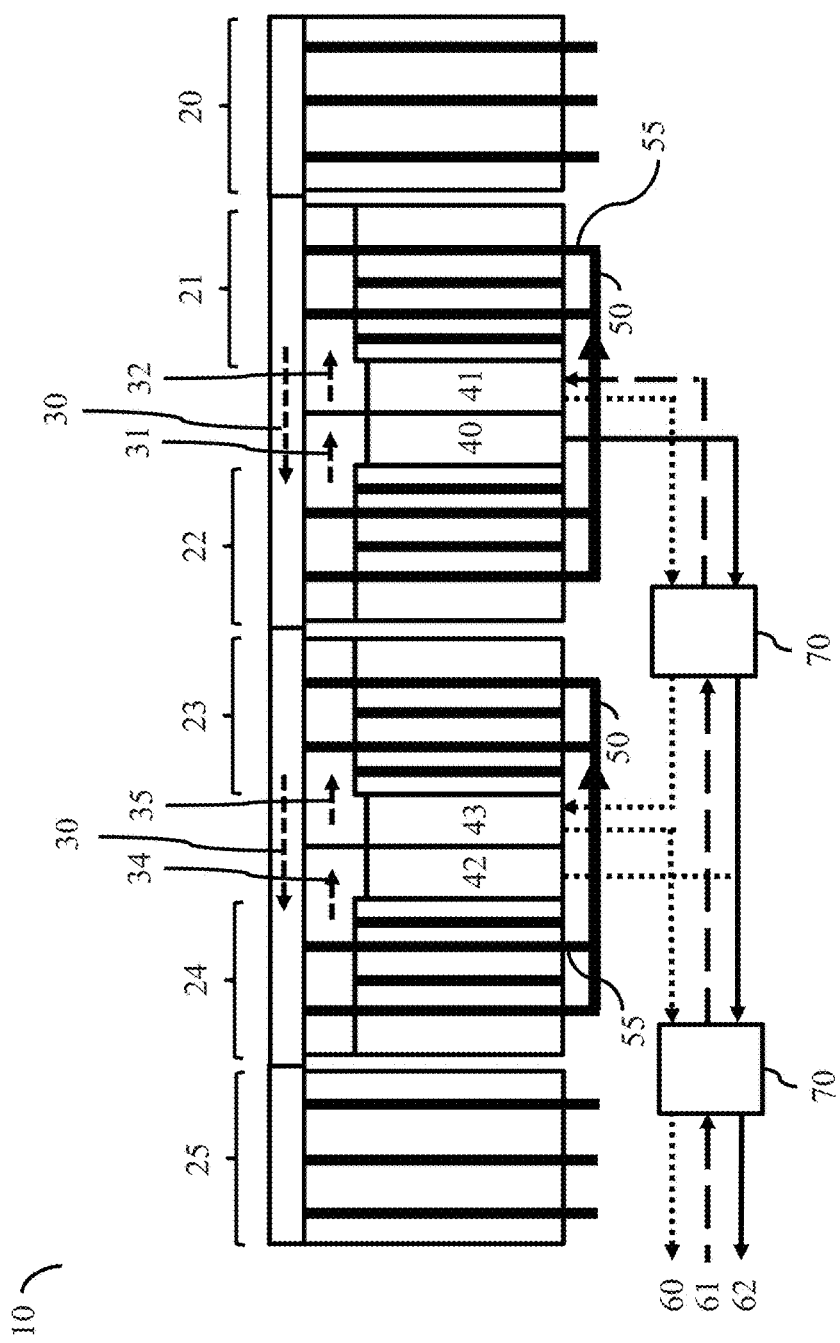
Figure 7:
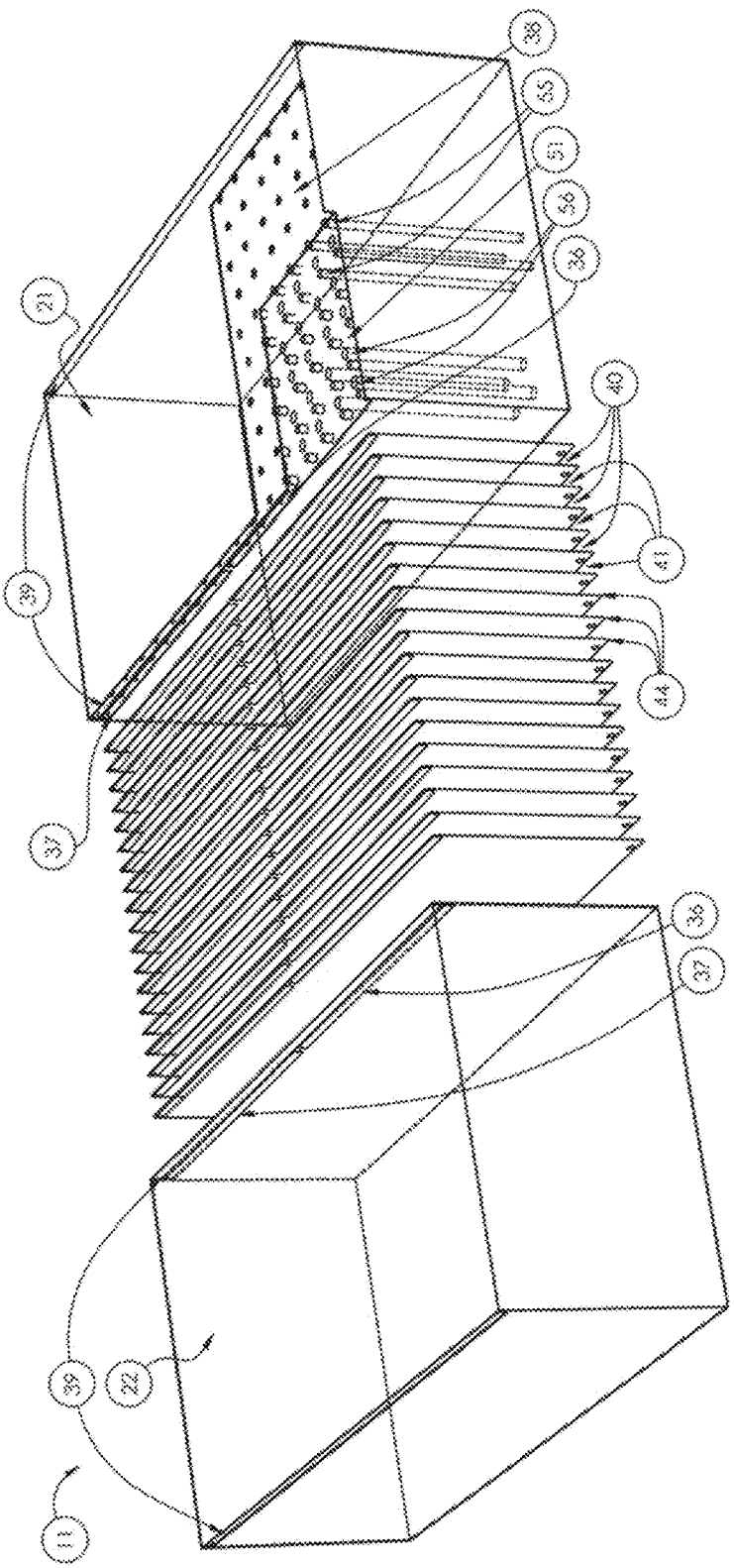
FIG. 7 is a drawing of a single adsorption stage with sectional cutouts on one bed to highlight internal structures.

The schematics shown in FIGS. 3 and 4 show schematics of connected adsorption stages operating in the two modes, "Forced" (FIG. 3), and "Relaxation" (FIG. 4), while FIG. 7 shows a physical drawing of a single adsorption stage with sectional cutouts on one bed to highlight internal structures. Dashed lines (see, e.g., 30, 31, 32) indicate vapor, solid lines (see, e.g., 50, 62) indicate liquid water, long dashed lines (see, e.g., 61) indicates input water, while dotted lines (see, e.g., 60) indicate the residual brine stream, which flows serially through each stage starting at the highest temperature. Each adsorption stage (e.g., FIGS. 3, 4, and 7, elements 21/22, 23/24) is composed of two beds, a hot and a cold, with a flat plate (FIG. 7 element 44) evaporator (FIGS. 3, 4, and 7, elements 41, 43) and condenser (FIGS. 3, 4 and 7 elements 40, 42) between them which evaporates (32, 35) input water and condenses (31, 34) distillate. Two vapor valves (FIG. 7 elements 36, 37) connect each bed to either the condenser or the evaporator, and each bed has both a grid of hollow tubes or channels (55), typically copper tubes, serving as a boiler/condenser to transfer heat via vapor (30) using a separate vapor plenum (FIG. 7, element 38) through valved ports between beds (FIG. 7, element 39) and a grid of vertical hollow channels (56) to transfer water vapor mass to/from the condenser/evaporator.

The heat transfer tubes and vapor plenum (FIGS. 3, 4, and 7, elements 55, 38) are a closed-loop system transferring only heat between adsorption beds, and is separated from the condenser/evaporator. While the heat flow in this closed-loop boiler is always from warmer to colder, a liquid pump, a liquid valve, and a vapor valve allows each adsorbent bed to transmit or receive heat in the form of vapor from adjacent beds, as shown by the returning liquid condensate flows just below the beds (50). The hot bed of the first stage operates at the highest temperature (21) is typically heated and desorbs water during the "forcing" phase (FIG. 9 element 324) using, for example, a thermal reservoir heated by solar energy (20), whereas the hot beds of subsequent stages (in the two stage example of FIGS. 3 and 4, element 23 is the only other hot bed), the heat comes from the sensible heat and latent heat of adsorption of the cold bed of the previous stage. The cold bed of the last stage (in this case, 24) transmits its final waste heat into a thermal sink (25), which is the input/cooling water source in this preferred design. Vapor (30) generated in the boiler tubes (55) by either the thermal reservoir (20) or the cold adsorption bed of each stage (22, 24) passes to the hot bed of the next stage or the thermal sink for the final cold bed (21 for 20, 23 for 22, and 25 for 24), and because the destination is at a lower temperature than the origin, the vapor (30) condenses in the vertical copper tubes (55) and latent heat is transferred to the destination, with the condensed liquid water pumped (50) back to fill the boiling tubes at the origin (20, 22, 24). The latent heat of vaporization is recycled from each condenser to the evaporator of the same stage to evaporate the input solution. The boiler heat transfer coefficient is governed by nucleate pool boiling and methods of boiling surface enhancements exist to minimize the boiling superheat, preferably using wall surface modification such as powder sintering. FIG. 4 shows that during "Relaxation", heat is no longer needed from the thermal reservoir (20) nor exhausted to the heat sink (25), but is instead transferred from the hot beds (21,23), which is now valved to the evaporators (41, 43), adsorbing water vapor from the evaporator (32, 35), and boiling the water in the boiling tubes (55) filled by the liquid condensate pump (50), to the cold beds of the same stage (22, 24), which is now valved and desorbing water vapor (31,34) to the condensers (40,42). The latent heat of vaporization from the condensers is again recycled to evaporate the input solution in the evaporator.

Figure 5:
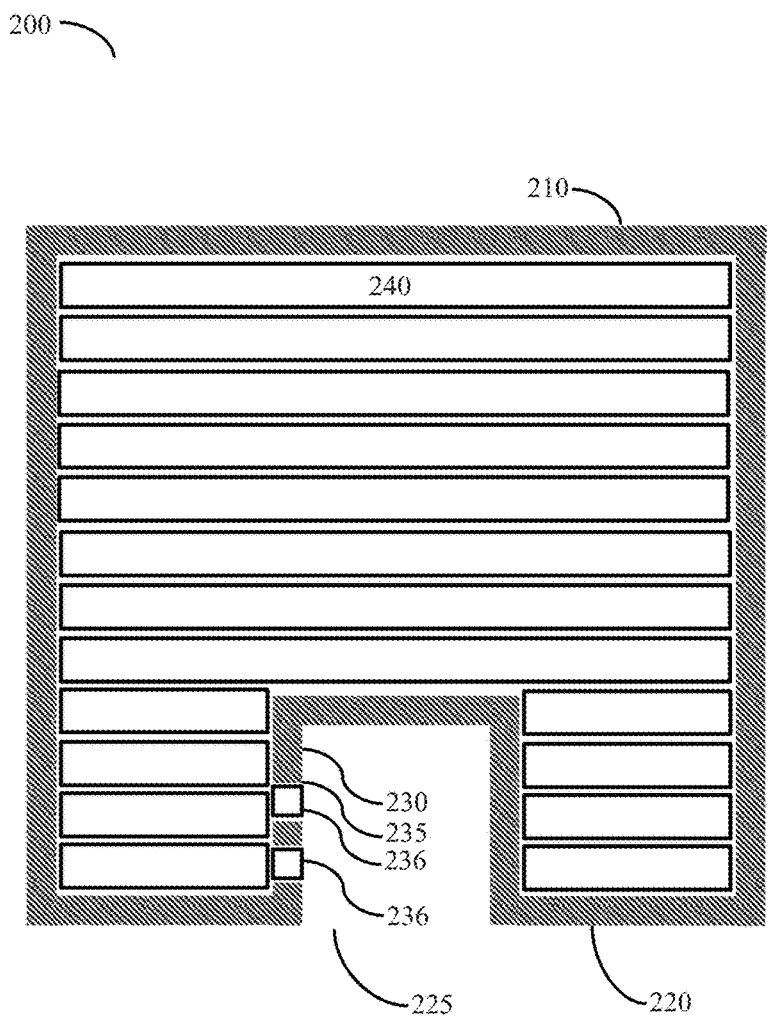
FIG. 5 depicts an exploded view of one embodiment of an adsorption bed, excluding the coil manifold.
Figure 6:
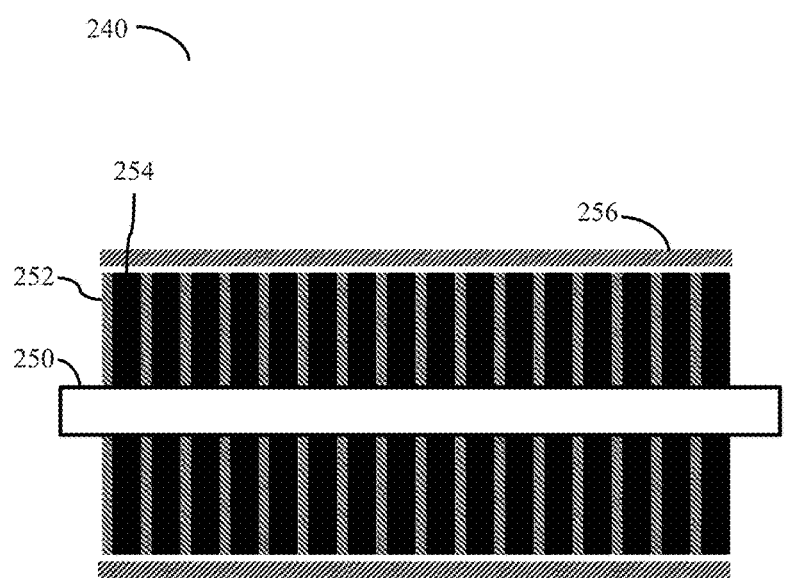
FIG. 6 depicts a more detailed view of an embodiment of an adsorbent bed coil.

One embodiment of a single adsorption bed (200) is shown in FIGS. 5-7. As shown in FIG. 5, the internal components of the bed (200) comprise a vacuum-tight casing (210). The casing (210) is shown that has a surface (220) defining at least one recess (225) into which at least one portion of a condenser or evaporator can be positioned. The casing (210) also comprises a second surface (230) defining at least one second opening (235), each second opening (235) connecting to at least one of a condenser or evaporator. A vapor valve (236) is typically positioned within or around each second opening (235). Each second opening (235) is capable of allowing vapor to exit after being desorbed or enter in order to be adsorbed by adsorbent. The adsorbent is part of a highly parallel winding defining the adsorbent bed coils (240). As shown in FIG. 6, the adsorbent bed coils (240) comprise powdered silica gel adsorbent (254) packed into tubing (250) with fins (252), kept in place with an outer covering (256), such as a mesh wrap. Significant quantities of silica gel are utilized for each bed. In preferred embodiments, between 100 and 5000 kg of adsorbent are used for each bed. In more preferred embodiments, between 250 and 500 kg are used. In a most preferred embodiment, 450 kg of silica gel will be used for each bed.

FIG. 7 shows one embodiment of a single stage (11) using vapor to transfer and recycle the heat of adsorption between beds, a pair of adsorption beds (21, 22) is combined with a flat plate (44) evaporator/condenser (40, 41) to make a single stage module. A flat plate evaporator/condenser is identical to the common flat plate heat exchanger, but with extra vapor and liquid inlet and outlets. The high surface area evaporator/condenser minimizes thermal resistance between the brine on the evaporator side and the distillate on condenser side, which keeps them isothermal. These flat plate evaporator/condensers are standard industrial equipment already made from metals formulated to avoid corrosion and pitting in hot seawater.

Figure 8:
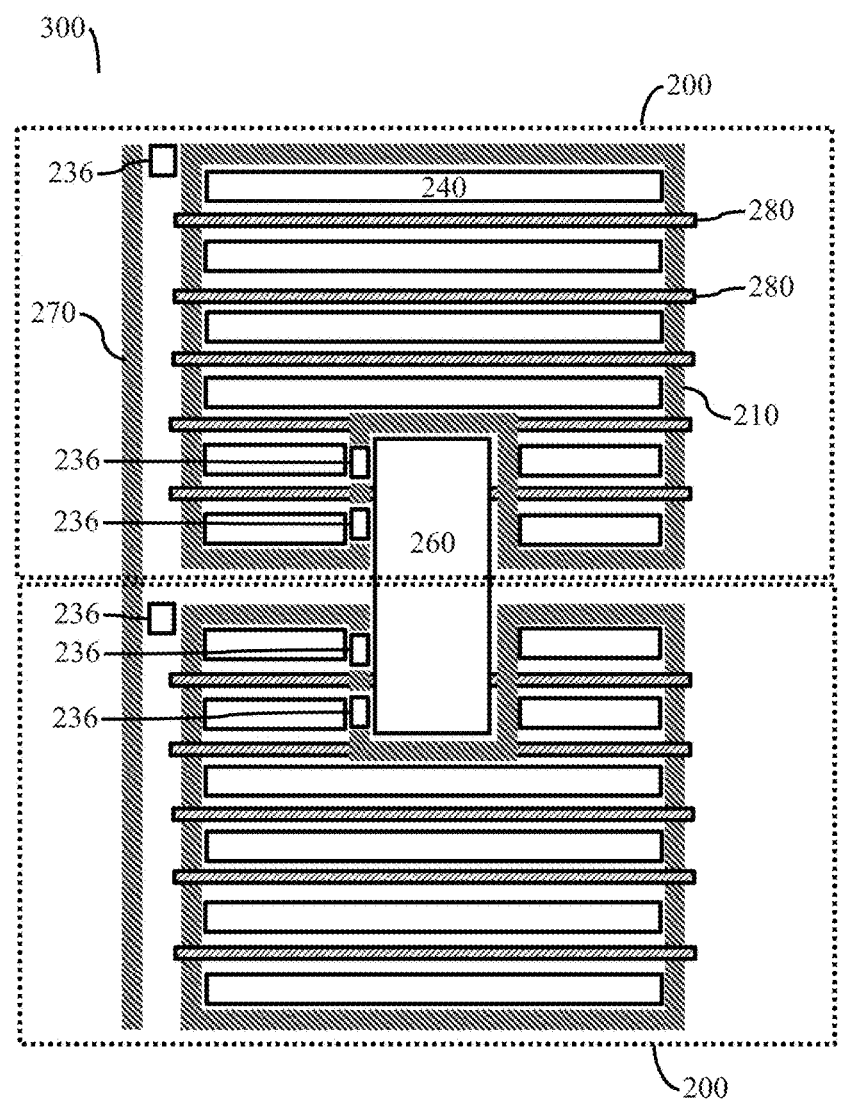
FIG. 8 depicts an embodiment of a single stage of a distiller.

In one embodiment shown in FIG. 8, adsorption beds are connected to either the condenser or the evaporator alternately using valves (236), but no vapor adsorbed and desorbed flows from any adsorbent bed to any other, only from/to the evaporator/condenser. Each stage is a pressure/vacuum vessel evacuated of air to, for example, about 0.5-10 kPa with either vacuum pumps or steam purges before the introduction of brine. Non-condensable gasses are kept out of the stages by pre-deaeration of the input seawater at an appropriately chosen temperature—for example, about 104-118° C. Each stage is thermally insulated on all sides, and heat transfer between beds is achieved using water circulation through the finned tubing. The electrical power required for circulation pumps comprise most of the electricity needed.

By connecting adsorbent coils in parallel with a manifold, minimizing flow lengths, and using efficient pumps, the total electrical energy intensity for the cycle may be reduced to 0.5 kWh/m$^3$ or less. This can be generated with a bank of photovoltaic (PV) panels.

In one embodiment, the only surface to contact brine will be one side of the evaporator/condenser, which will not only be designed for automated acid or chemical cleaning of scale build-up, but is also a maintainable component than can be disassembled and pressure washed. This is in contrast to typical MED plants with extended heat transfer surfaces which can be difficult to maintain.

In one embodiment, manufacturing is relatively simple due to the low component count. Each distiller is assembled from a large number of identical adsorption stages. As shown in FIG. 8, each stage (300) is made from two identical adsorption beds (200). The adsorption beds (200) will be made to serve as the frame for the flat plate evaporator/condenser (260) and the heat exchanger plates can be manufactured from a variety of corrosion resistant metals. The engineering and fabrication of each adsorption stage will need to be carefully designed, as each stage will need to be sealed into three sealed compartments (the area within each casing (210) and the volume of space between casing (210) and an upper surface (270) through which vapor can pass through one of the vapor valves (236) and enter one of the hollow channels (280), comparable to channels (55) in FIGS. 1 and 2. The hollow channels (280) will need to be in place during the mechanical compression of the adsorbent material. Each stage also may contain multiple vapor valves; this figure utilizes six vapor valves (236).

For the purpose of illustrating how the cycle works, this disclosure refers to a two stage system as shown in FIGS. 3-4 and assume that at the start, both beds in Stage 1 for hot (21) and cold (22) are at the same temperature, but at a higher temperature than beds in Stage 2 (23 and 24), which are also at the same temperature.

In the "Forced" (i.e., heat-driven) phase, first bed (21) is heated by condensing vapor in the boiler tubes generated by the heat source (20). Condensed water in the boiler tubes is pumped back to fill the boiler tubes in the heat source, as indicated by the line (50) just below the bed and the heat source.

The first bed (21) is open to the condenser, and the increase in temperature causes the adsorbent to desorb vapor increasing the water vapor pressure and temperature in the condenser. This causes condensation and a transfer of the heat of vaporization to the input water in the evaporator. The second bed (22) is open to the evaporator and its boiler tubes are full and transferring heat to the third bed via vapor (23). The cooling of the second bed (22) causes it to adsorb the vapor from the evaporator. The heat of adsorption from second bed (22) will continue to transfer to third bed (23) until it reaches the equilibrium uptake at the lower temperature.

Second stage beds (23 and 24) started at the same temperature, but with third bed (23) receiving heat from second bed (22), it will also desorb vapor which will condense and evaporate more input water which will be adsorbed by fourth bed (24). The final bed exhausts adsorption heat to a condenser (25) cooled by the final residue water, distillate, and cooling water.

At the end of the "forcing" phase, the adsorption beds have become separated in temperature and uptake, with each of the hot beds hotter and drier than the cold beds in each stage. The "relaxation" phase connects the hot and cold beds of each stage (i.e., 21/22, 23/24) to allow them to come back to equilibrium. As heat transfers from the hot to cold bed, the cold bed desorbs vapor into the condenser, which in turn evaporates input water adsorbed by the hot stage.

Adsorption Uptake Equilibrium and Kinetics

The adsorption distillation cycle depends on the "pull-push" action of the adsorbent to pull vapor when adsorbing and push when desorbing, so a discussion of adsorbent equilibrium and kinetics is necessary.

The equilibrium uptake (kg/kg, adsorbed water mass per mass of adsorbent) of the adsorbent has been measured and published by others and can be fitted as a function of a single variable, the free energy of adsorption, $\Delta F = -RT \cdot \ln(P_{water}/P_{saturated})$, where $P_{saturated}$ is the saturated water vapor pressure at the temperature of the adsorbent. There were no significant differences between fits using Aristov's formulas based on the Dubinin-Polanyi potential or fits using Tóth's equation used by Chua. A computer program based on these equations was written to calculate cycle parameters. A plot of the equilibrium uptake of the adsorbent is shown in FIG. 9.

Figure 9:
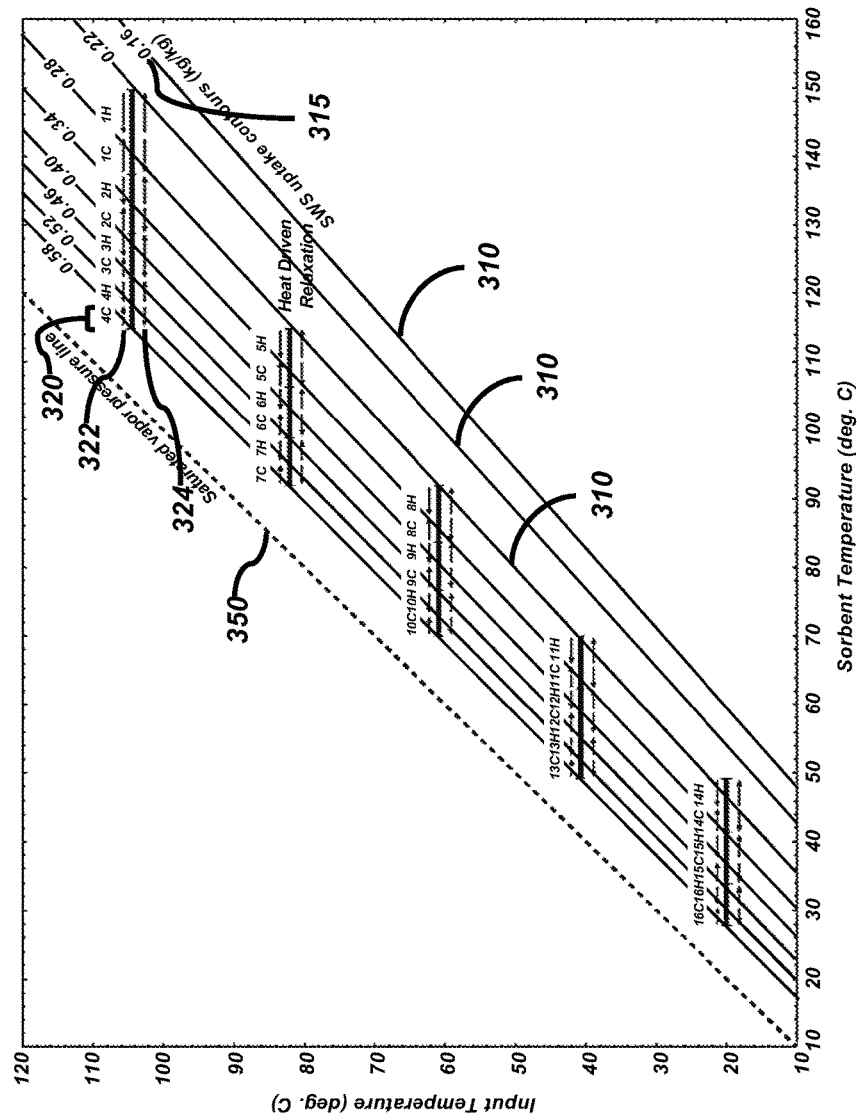
FIG. 9 shows a representative uptake diagram.

In FIG. 9, the uptake is defined as the mass adsorbed per mass of the adsorbent (kg/kg) with numeric values (315) of each contour (310) shown near the top. The saturate vapor pressure line (350) is also shown as a dashed line. One embodiment of our cycle reaches 0.58 maximum uptake. By operating the condenser and evaporator isothermally, the parallelogram of a typical adsorption chiller cycle has been compressed into a horizontal line. The thermodynamic theory of this cycle has been discussed by others, where all possible temperature combinations of a single stage condenser/evaporator were analyzed theoretically.

To make the plot easier to read, the y-axis is plotted as the temperature of the water with the saturated vapor pressure rather than the typical logarithmic vapor pressure scale. This is done because we are interested in the temperature of the water in the evaporator, which determines the vapor pressure over the adsorbent.

The operating range of each adsorption bed (320) is shown overlaid on the uptake contours (310) in FIG. 9. The horizontal black lines indicate the operating temperature ranges for each stage. Arrows above (322)/below (324) the black line indicate the expected temperature movement of each hot and cold bed for each stage during the heat driven/relaxation modes, respectively. Note the arrows do not fully approach adjacent beds for either mode of operation, this is merely a result from the modelled thermal approach between beds for a cycle time of 480 seconds.

In one embodiment, the uptake change for each bed is designed for 3.2%. With 325 kg in each bed, 32 total beds, and a cycle time of 480 s, the daily output from one distiller is 60 m³. The design includes sufficient solar collection and hot water storage with a swing from 150-180° C. to power the distiller during nighttime.

Adsorption kinetics determines the water production rate. One embodiment of a cycle has been designed using the linear driving force kinetic equation found in a number of published journal articles from independent research groups. In this embodiment, each stage is designed for an uptake swing of 0.034 kg/kg within 6 minutes. Adsorption beds at lower temperatures in FIG. 9 have slower kinetics, and are therefore designed with larger initial uptake differentials.

One embodiment of this system uses a serial flow pattern to achieve high recovery ratios (80%), where most of the water is extracted from the brine, rather than discharged. This can be increased further for wastewater remediation applications where minimal residual discharge is desirable.

Top Brine Temperature for Seawater Desalination

One example design, similar to that illustrated in FIG. 1, is based on 150° C. input heat, since this the temperature of the highest stage. This is useful to illustrate how the adsorption distiller is also able to use higher temperature or exergy heat sources to increase efficiency without being limited by the scaling of inverse temperature solubility salts including $CaSO_4$, $Mg(OH)_2$, and $Ca_3(PO_4)_2$. The scaling from these salts on heat transfer surfaces typically limits the highest temperature seawater can be heated to between 90° C. to 110° C., depending on the anti-scaling chemicals used and whether the input water is pretreated using micro/nano-filtration to partially remove salt ions. The adsorption distiller overcomes the top brine limit because the adsorbent is operated above the brine temperatures allowing higher temperature input heat to drive more stages even while the seawater remains at around 100° C. Also, because the evaporator is operated as a pool boiler rather than a film evaporator, local scaling, where local concentration limits are violated due to excessive local evaporation, should have reduced severity. We currently do not anticipate using anti-scalant chemicals, relying instead on techniques such as acid washing or Taprogge cleaning balls in the evaporator.

The top brine temperature in one embodiment was selected to remain below 120° C. to stay below the solubility limit of hard $CaSO_4$ scaling. The brine flow is serial from one evaporator to the next in decreasing temperature order and increasing salinity, as seen in FIGS. 1-2. In thermal desalination without nanofiltering, the top brine temperature limits thermal efficiency because the brine is the hottest component in the system. However, in the adsorption cycle, the adsorbent can be operated at a higher temperature than the brine to achieve higher thermal efficiency. Silica gel used in desiccant wheels is reliably regenerated for many cycles above 150° C.

FIG. 9 illustrates the continuity of the cycle. Each adsorption stage follows the next in temperature, but the input water experiences several temperature variations as it flows serially from the highest temperature stage to the lowest. In FIG. 9, stages 1-4 operate at the evaporator/condenser temperature of 104° C., stages 5-7 at 82° C., stages 8-10 at 61° C., stages 11-1 at 41° C., and stages 14-16 at 20° C. Other temperatures are also envisioned, and will preferably range from around 20° C. to around 120° C. Both the residue water and the distillate will be at these evaporator/condenser temperatures, and are heat exchanged with the incoming input water using flat plate heat exchangers (70) as shown in FIGS. 1-4.

FIG. 9 also shows the trajectory of each bed during both phases of the cycle. Each horizontal black segment in FIG. 9 represents the operating range of both beds in an stage. It can be seen that the stages in this embodiment operate at brine temperatures between about 20° C. to about 105° C., and that the adsorbent bed temperatures decrease monotonically through the stage chain from about 150.0° C. to about 30° C. In some embodiments, multiple stages—for example, three to four stages—may operate at each brine temperature in a sequence of decreasing brine temperatures. In these embodiments, intake seawater to product water heat exchangers may be introduced after every three to four stages. Arrows above segments show beds "relaxing" towards the midpoint in temperature and uptake, with arrows pointing left denoting cooling and arrows pointing right denoting heating. The opposite occurs during the "forcing" phase, where beds in each stage are driven out of equilibrium by the heat source (FIGS. 3 and 4 element 20), cooling by the heat sink (FIGS. 3 and 4 element 25), or by thermal connection to a bed in an adjacent stage (FIGS. 3 and 4 elements 22, 23).

System Integration and Packaging

Figure 10:
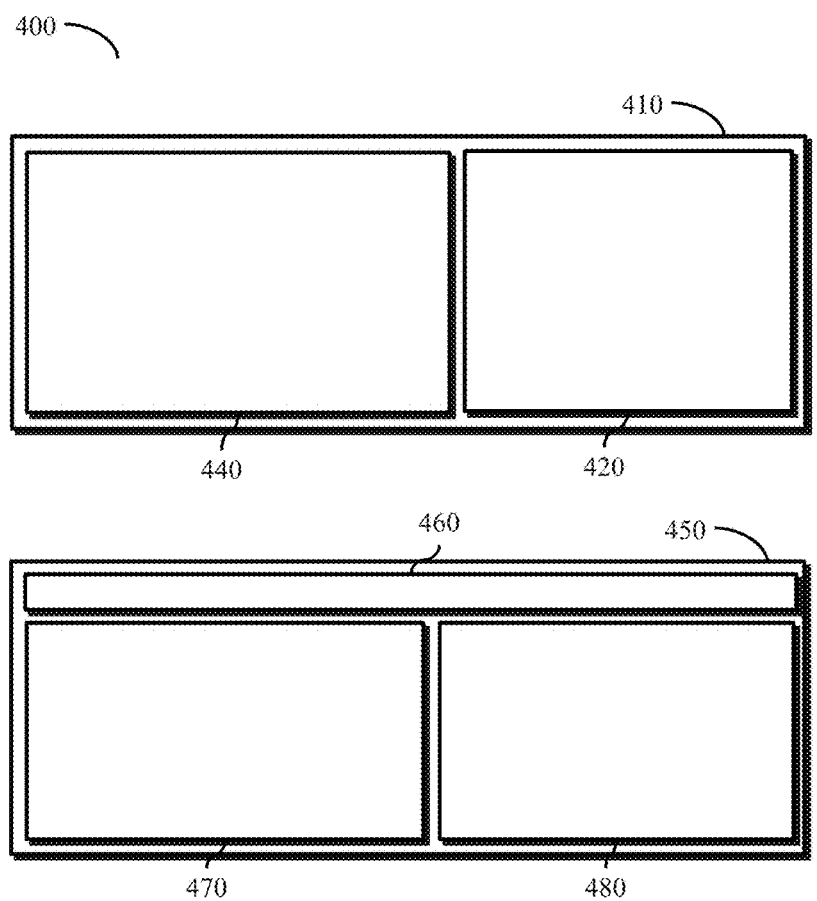
FIG. 10 depicts an embodiment of a system employing the distiller.

FIG. 10 shows a view of one embodiment of a single desalination unit (400), packaged into two housing units (410, 450), which in this embodiment can be, for example, shipping containers. The low-profile solar thermal collector arrays (470), PV panels (460), hot water/thermal storage (420) and batteries (480) make up most of the system. In some embodiments, the thermal storage (420) is configured to provide about 750 kWh, and the batteries (480) are configured to provide about 7 kWh. The adsorption modules (440) and hot water storage (420) may be insulated by, for example, about 30 cm of rigid polyurethane/polystyrene, which is not shown in the figure for clarity. Also not shown are plumbing connections, valves, circulation pumps, and control systems.

The thermal collector arrays and PV arrays may be deployed outside the housing units, while the adsorption modules operate inside the housing units. In some embodiments, the housing units may be behind PV arrays, and may act as support structures for the PV arrays. These housing units may be located in practically any location, including near water sources such as oceans or seas.

Table 1 summarizes specifications for one embodiment of the desalination unit.

TABLE 1

| | |
|---|---|
| Water production (annual average) | 60 m³/day or 16000 gpd |
| Thermal GOR/PR | ~28 |
| Energy intensity | 23 $kWh_{th}$ + 0.1 $kWh_e/m^3$ |
| Adsorption cycle time | 480 s |
| Adsorbent mass per bed | 325 kg |
| Recovery Ratio | 72% |
| Land footprint | 400 m² or 4306 ft² |
| Solar thermal collection area | 450 m² (incl. night storage) |
| PV panel installed watts | 2250 W (incl. night storage) |
| Assumed insolation | 5 kWh/m²/day |

Other Features

Exergy efficiency on the adsorption distiller can be optimized in real time to maximize water production based on changing conditions. Optimization may be based on only three (3) input parameters: input heat temperature, exhaust temperature, and the amount of heat available. The only actuators for control may be the switching times and durations of the relaxation and heat driven modes. Automation of the process can occur using a real-time optimized controller using a low-power embedded computer with cellular connectivity, such as the Raspberry Pi and/or Particle Electron, to allow remote control and data logging of operational units worldwide.

What is claimed is:

1. A distillation system, comprising:
 a plurality of operatively connected open-cycle adsorption stages, including a first stage and a second stage, each stage comprising:
  a plurality of operatively connected beds, including a first bed and a second bed; and
  an evaporator and a condenser operatively connected to the first bed and the second bed;
 a switchable heat source configured to provide heat to one of the plurality of operatively connected beds in one of the plurality of operatively connected open-cycle adsorption stages only during a first operating phase to desorb water vapor; and
 a switchable heat exhaust configured to remove heat from another of the plurality of operatively connected beds in one of the plurality of operatively connected open-cycle adsorption stages only during the first operating phase to remove the heat of adsorption;
 wherein each bed comprises at least a first, second, and third vapor valve, at least one hollow tube, at least one channel adapted for transferring water vapor to and from at least one of the condenser or the evaporator, and a thermally conductive water vapor adsorbent,
 wherein the first vapor valve connects the bed to the condenser, the second vapor valve connects the bed to the evaporator, and the third vapor valve connects a volume inside the hollow tubes of the first bed with a volume inside the hollow tubes of the second bed, wherein the distillation system is configured to transfer both a sensible heat and a heat of adsorption from the second bed of each stage to the first bed of the subsequent stage, excepting the last stage, wherein a temperature of the first bed of a respective subsequent stage is lower than a temperature of the second bed of a respective previous stage, during the first operating phase, wherein the distillation system is configured to desorb water vapor from the first bed of each stage into the condenser of each stage and adsorb water vapor from the evaporator of each stage into the second bed of each stage during the first operating phase, wherein the distillation system is configured to transfer both a sensible heat and a heat of adsorption from the first bed of each stage to the second bed of the same stage, wherein a temperature of the second bed of each stage is lower than a temperature of the first bed of the same stage, during a second operating phase, and wherein the distillation system is configured to desorb water vapor from the second bed of each stage into the condenser of each stage and adsorb water vapor from the evaporator of each stage into the first bed of each stage during a second operating phase.

2. The distillation system of claim 1, wherein each evaporator and condenser is shared between the first bed and second bed of each of the respective stages, wherein the evaporator is capable of receiving both a sensible heat and a heat of vaporization from the condenser to generate water vapor from solution comprising water and at least one dissolved impurity, and wherein each evaporator is configured to receive a solution comprising water and at least one dissolved impurity, the solution having a temperature predetermined to suit the equilibrium uptake of an adsorbent, where a suitable temperature is determined by first selecting both a desired operational temperature range and uptake range for the adsorbent, then selecting the solution temperature such that the saturated water vapor partial pressure corresponds to the desired adsorbent temperature and uptake range.

3. The distillation system of claim 1, wherein the hollow tubes are comprised of at least one material selected from a group consisting of copper, aluminum, and steel, and wherein the thermally conductive water vapor adsorbent is comprised of a porous media, at least one material selected from a group consisting of calcium chloride, lithium bromide, and lithium chloride, and a plurality of graphite nanosheets, each graphite nanosheet having between about 1 and about 100 carbon atom planes in thickness, and having a characteristic diameter of less than 300 microns.

4. The distillation system of claim 1, wherein a volume in the first bed is a volume defined as the sum of the volume inside the hollow tubes of the first bed plus the volume of a vapor plenum;

wherein the third vapor valve is adapted for allowing controlled vapor flow and heat transfer between beds;

wherein the volume in the first bed can be evacuated of non-condensable gases and selectively filled or drained of a volatile fluid to allow the volume to generate or condense vapor, respectively;

wherein heat from the thermally conductive water vapor adsorbent conducted through the hollow tube wall into the volume of the first bed vaporizes at least some of the volatile fluid at a first temperature, after which the vaporized fluid is transmitted and condensed in the volume within the second bed which is at a second temperature lower than the first temperature;

and wherein, when heat from the thermally conductive water vapor adsorbent is not vaporizing at least some of the volatile fluid, the system is capable of having vapor generated from a second bed or the heat source at a third temperature higher than the second temperature flow into the volume of the first bed and condense, conducting heat out of the volume through the hollow tube wall and into the thermally conductive water vapor adsorbent.

5. The distillation system of claim 1, wherein the operational range in temperature and adsorbed water uptake for each bed is selected, based on the physical equilibrium properties of the adsorbent, to correspond with the saturated vapor partial pressure of the input solution at a particular temperature; the resultant operational temperature ranges of all beds of all stages forming a continual sequence between the temperatures of the heat source and the heat exhaust.

6. The distillation system of claim 1, further comprising a pre-deaeration unit that receives an input liquid, and outputs a deaerated liquid to the first open-cycle adsorption stage.

7. The distillation system of claim 1, further comprising at least one heat exchanger for transferring heat between fluid entering at least one of the evaporators from the plurality of operatively connected open-cycle adsorption stages and at least one fluid exiting from at least one component selected from the group consisting of the condenser from at least one of the plurality of operatively connected open-cycle adsorption stages and the evaporator from at least one of the plurality of operatively connected open-cycle adsorption stages.

8. The distillation system of claim 1, further comprising an electrical power source.

9. The distillation system of claim 8, wherein the power source comprises a plurality of solar cells.

10. The distillation system of claim 4, wherein the system is configured such that the heat of adsorption generated by the second bed of a final stage of the plurality of operatively connected open-cycle adsorption stages is capable of being exhausted externally.

11. The distillation system of claim 1, wherein the first stage operates at temperatures between 105° C. and 210° C., and the plurality of stages comprises at least three stages.

12. The distillation system of claim 1, further comprising a plurality of solar cells configured to provide electrical power for the distillation system, and a plurality of solar thermal collectors adapted to provide thermal power for the distillation system.

* * * * *